(12) United States Patent
Durocher et al.

(10) Patent No.: US 7,427,566 B2
(45) Date of Patent: Sep. 23, 2008

(54) METHOD OF MAKING AN ELECTRONIC DEVICE COOLING SYSTEM

(75) Inventors: Kevin Matthew Durocher, Waterford, NY (US); Stacey Joy Goodwin, Niskayuna, NY (US); Ernest Wayne Balch, Ballston Spa, NY (US); Christopher James Kapusta, Delanson, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/297,868

(22) Filed: Dec. 9, 2005

(65) Prior Publication Data
US 2007/0131645 A1    Jun. 14, 2007

(51) Int. Cl.
*H01L 21/302* (2006.01)
(52) U.S. Cl. .................. 438/689; 438/706; 438/708; 438/712; 438/717; 165/80.3; 165/168; 361/676; 361/687; 361/699; 257/717; 257/706
(58) Field of Classification Search ............. 165/80.3; 361/676; 257/717; 438/689
See application file for complete search history.

(56) References Cited

U.S. PATENT DOCUMENTS

| | | | |
|---|---|---|---|
| 5,488,255 A * | 1/1996 | Sato et al. .................... 257/718 |
| 5,692,558 A | 12/1997 | Hamilton et al. ............ 165/80.4 |
| 5,727,618 A * | 3/1998 | Mundinger et al. ......... 165/80.4 |
| 5,998,240 A | 12/1999 | Hamilton et al. ............ 438/122 |
| 6,014,312 A | 1/2000 | Schulz-Harder et al. .... 361/699 |
| 6,131,650 A | 10/2000 | North et al. .................. 165/170 |
| 6,529,394 B1 | 3/2003 | Joseph et al. ................ 363/141 |
| 6,675,875 B1 * | 1/2004 | Vafai et al. ................... 165/80.4 |
| 6,678,182 B2 | 1/2004 | Joseph et al. ................ 363/141 |
| 6,885,086 B1 | 4/2005 | Fogelson et al. |
| 6,919,231 B1 | 7/2005 | Ramanathan et al. |
| 6,992,382 B2 * | 1/2006 | Chrysler et al. .............. 257/717 |
| 2003/0066634 A1 | 4/2003 | Valenzuela et al. .......... 165/148 |
| 2004/0018611 A1* | 1/2004 | Ward et al. ................ 435/287.2 |
| 2007/0119574 A1 | 5/2007 | Olesen et al. |

OTHER PUBLICATIONS

S. Frederico, IEEE The 16th International Conference on MEMS (2003) pp. 570-573.*
Stevanovic et al.; "Heat Sink With Microchannel Cooling for Power Devices"; U.S. Appl. No. 10/998,707, filed Nov. 24, 2004.

* cited by examiner

*Primary Examiner*—Nadine Norton
*Assistant Examiner*—Maki Angadi
(74) *Attorney, Agent, or Firm*—Fletcher Yoder

(57) ABSTRACT

A method is provided. The method includes forming a conductive layer on an inner surface of a substrate and providing a sacrificial layer over the conductive layer. The method includes forming a plurality of channels in the sacrificial layer and plating the sacrificial layer to substantially fill the plurality of channels with a plating material comprising conducting material. The method also includes etching the sacrificial layer to form a conducting structure having fins where conducting material remains separated by microchannels where the sacrificial layer is etched.

24 Claims, 10 Drawing Sheets

METHOD OF MAKING AN ELECTRONIC DEVICE COOLING SYSTEM

BACKGROUND

The invention relates generally to a cooling system for electronic devices, and in particular to processes for fabricating microchannels for circulating a fluid in a device cooling system.

The development of high density power electronics has made it increasingly more difficult to fabricate efficient cooling systems. With modern silicon based power devices capable of dissipating heat up to 500 W/cm$^2$, there is a need for improved thermal management solutions. Natural and forced-air cooling schemes can only handle heat fluxes of up to about 1 W/cm$^2$. Conventional liquid cooling plates can achieve heat fluxes of the order of 20 W/cm$^2$. However, microchannel cooling technology has demonstrated the ability to greatly enhance cooling performance, on the order of about 1000 W/cm$^2$.

In certain proposed structures, microchannels are fabricated on the reverse side of power devices through which a coolant fluid is circulated to dissipate heat generated by the device. The efficiency of cooling depends on the width and the uniformity of the channels. Within certain limits, for example, narrower channels tend to dissipate heat better due to better contact with the coolant fluid. However, the increased heat transfer in narrower channels may often be offset by increased pressure losses across the channel, which may result in challenges in forcing cooling fluid through the system. Another limitation may be the non-uniformity of the microchannels, which may result in hot spots that may adversely affect the performance of the power device and may even result in break-down of the devices. Silicon is the commonly used material for microchannel fabrication. However, channels made of material having higher thermal conductivity than silicon may show better efficiency due to their better heat transfer properties.

Moreover, while such structures have been proposed and tested, efficient and economical method for their manufacture is still lacking. The stringent requirements of reliably creating uniform microchannels have simply not been addressed adequately in the art.

Therefore, there is a need for improving the current techniques for fabricating microchannels with narrower channel width and better uniformity. There is, in particular, a need for fabricating such devices in an efficient, low-cost manner.

BRIEF DESCRIPTION

Embodiments of the present invention address this and other needs. In one embodiment, a method is provided. The method includes forming a conductive layer on an inner surface of a substrate and providing a sacrificial layer over the conductive layer. The method includes forming a plurality of channels in the sacrificial layer and plating the sacrificial layer to substantially fill the plurality of channels with a plating material comprising conducting material. The method also includes etching the sacrificial layer to form a conductive structure having fins where conducting material remains separated by microchannels where the sacrificial layer is etched.

DRAWINGS

These and other features, aspects, and advantages of the present invention will become better understood when the following detailed description is read with reference to the accompanying drawings in which like characters represent like parts throughout the drawings, FIG. 1 illustrates an exemplary cooling system for a power device fabricated in accordance with aspects of the present invention;

DETAILED DESCRIPTION

Figure 1:
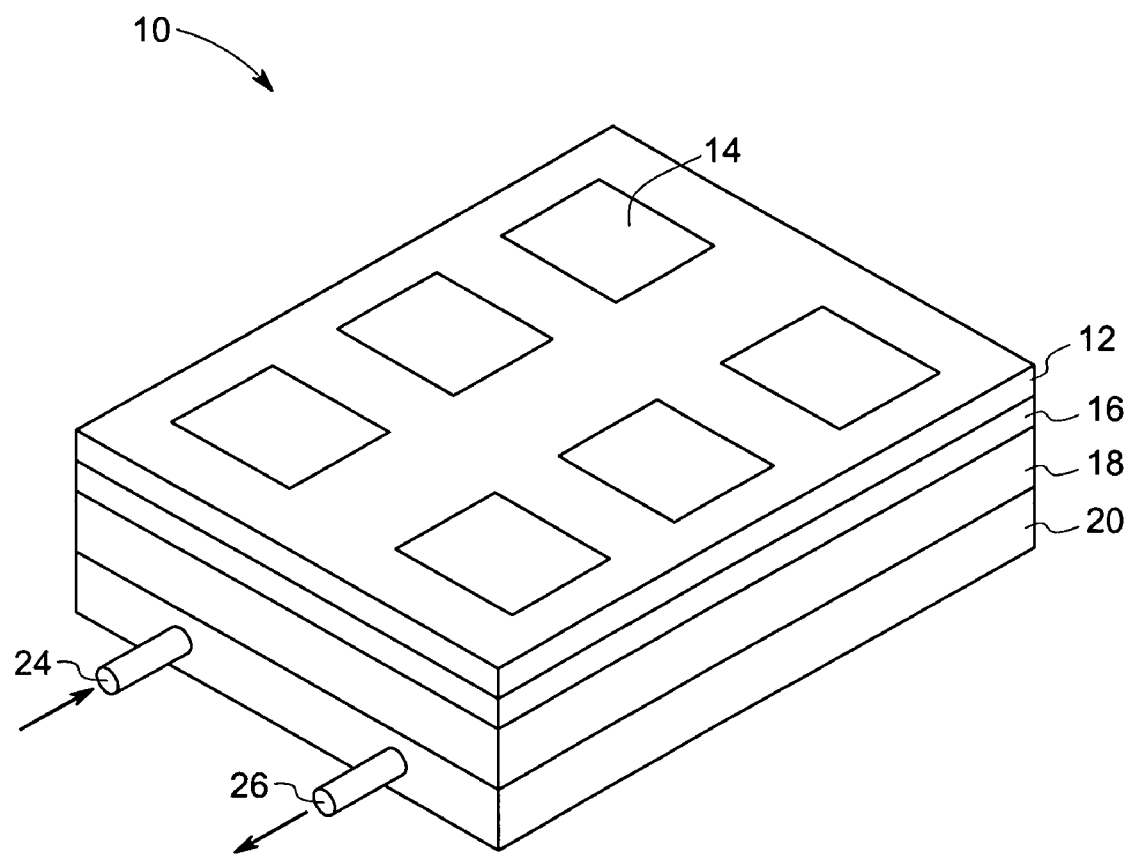

FIG. 1 is a schematic representation of an electronic circuit assembly 10 for a device, such as a power electronic device. The circuit assembly 10 includes a substrate 12. The substrate 12 may comprise semiconductors commonly used in power electronic devices, such as silicon, silicon carbide, alumina, aluminum nitride, gallium nitride or a combination thereof. The devices 14 are mounted proximate to a surface of the substrate 12, as shown in FIG. 1. The figure depicts six such devices 14 mounted on the substrate 12. As will be appreciated by one skilled in the art, any number of devices or even a single device may be mounted on the substrate. Similarly, any desired devices may be mounted on the substrate, particularly devices that generate significant heat during operation that requires extraction or dissipation. Such devices may include, for example, solid state switching devices.

Further, the system 10 includes a conductive layer 16 disposed on the opposite surface of the substrate 12. The conductive layer 16 may comprise any suitable thermally conducting material, such as copper. The conductive layer may act as a heat dissipation interface between the device 14 and cooling system due to its enhanced heat transfer properties.

A heat exchange layer 18 is placed on the conductive layer 16. The heat exchange layer 18 includes microchannels 22 for flowing a coolant. Suitable coolants include oil, water, ethylene glycol, aircraft fuel or a combination thereof. It should be noted that a liquid or gaseous coolant may be used, and the invention is not intended to be limited to either, or to any particular cooling medium. A manifold 20 is attached to the heat exchange layer 18. The manifold 20 further includes an inlet plenum 24 for directing the coolant to the microchannels, and an outlet plenum 26 to exhaust the coolant from the microchannels. The details of the manifold structure are shown in FIG. 2.

Figure 2:
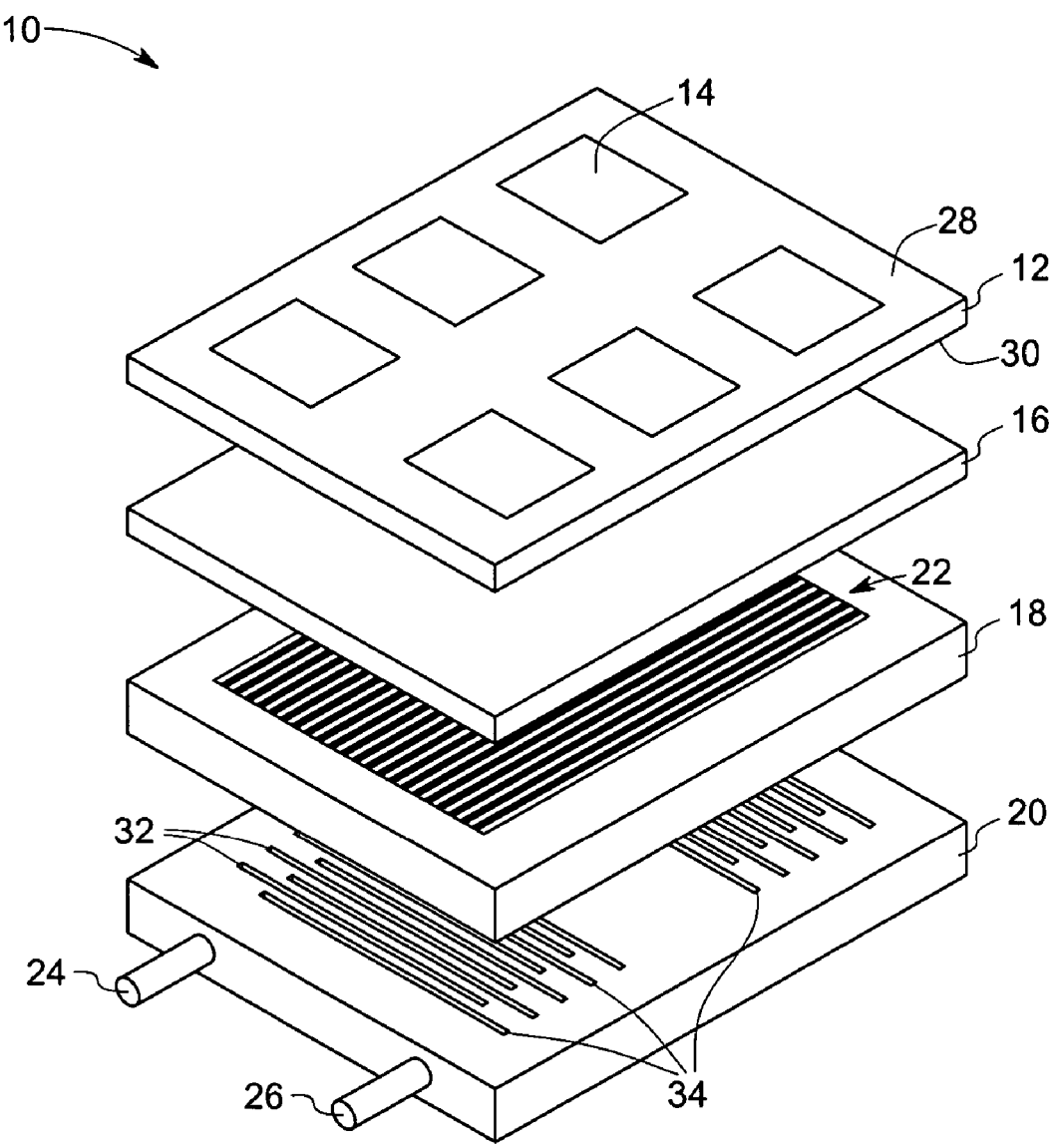
FIG. 2 is an exploded view of the cooling system with the power device shown in FIG. 1.

FIG. 2 is an exploded view of the circuit assembly 10 illustrated in FIG. 1. A surface of the substrate 12, on which the device 14 is mounted is represented as an outer surface 28, and the opposite side on which the conductive layer 16 is formed is represented as an inner surface 30. The heat exchange layer 18 is disposed on the conductive layer 16 and microchannels 22 are formed in the heat exchange layer 18.

The microchannels 22 extend from the conductive layer 16 to the manifold 20. The manifold 20 have two sets of channels 32 and 34 formed on a surface facing the microchannels 22. The inlet plenum 24 introduces a coolant to the microchannels 22 through the set of channels 32, otherwise referred to as inlet manifolds. The outlet plenum 26 exhausts the coolant from the microchannels 22 through the set of channels 34, and these channels are referred to as outlet manifolds. The fabrication of the microchannels 22 will be discussed below.

Figure 3:
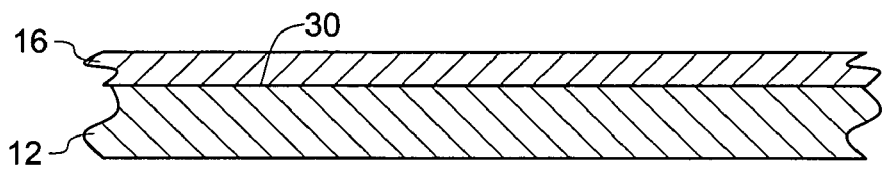
FIGS. 3-9 illustrate fabrication stages of microchannels for a device of the type shown in FIGS. 1 and 2 in accordance with a plating technique.

FIGS. 3-9 illustrate fabrication stages of microchannels 22 in accordance with one embodiment. The substrate 12 having the inner surface 30 is provided as shown in FIG. 3. The substrate 12 may be a semiconductor and in this instance is made of silicon carbide. The conductive layer 16 is disposed on the substrate 12. The conductive layer may be formed using deposition techniques such as electroplating. In this embodiment, a thickness of the conductive layer is less than about 300 microns. Further, the conductive layer 16 is made of a material having good thermal conductivity such as copper. Other materials that can be used include gold and silver.

Figure 4:
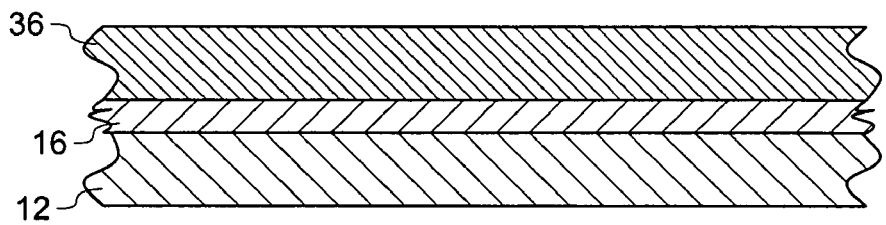

A sacrificial layer 36 is then disposed on the conductive layer 16 as shown in FIG. 4. In this example, sacrificial layer 36 is made of silicon, although other materials may be used. In the illustrated embodiment, the thickness of the sacrificial layer 36 formed is less than about 400 microns. It should be noted that the thickness of the layer 36 may vary depending on depth of microchannels desired.

Figure 5:
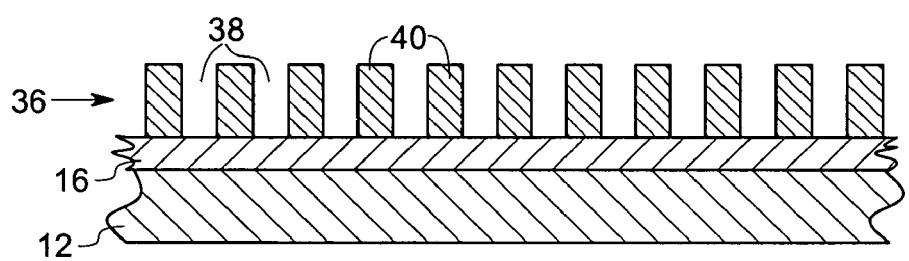

FIG. 5 depicts channel formation in the sacrificial layer 36 of FIG. 4. In the illustrated embodiment, grooves are represented by reference numeral 38, and reference numeral 40 represents ribs of the channel. The formation of the channels is through etching the sacrificial layer 36 using an etchant. For example, potassium hydroxide solution is an etchant for a sacrificial layer made of silicon. Potassium hydroxide preferentially etches silicon while the underlying conductive layer 16 is not affected. Prior to etching, in one example, regions that may form ribs may be masked and then potassium hydroxide solution is used to remove regions of silicon exposed to the potassium hydroxide solution. Further, the exposure to the potassium hydroxide solution is continued until the conductive layer 16 is reached. Vertical channels as depicted in figures, may be formed. The grooves 38 of the channel may have a depth related to the thickness of the sacrificial layer 36 formed. In a present embodiment, the grooves 38 may have a depth of less than about 400 microns. In a particular example, the grooves 38 may have a depth of from about 300 microns to about 400 microns. The formation of channels results in a rib 40 having a width of less than about 200 microns. In a specific embodiment, the ribs 40 have a width of about 100 microns to about 200 microns. As will be appreciated by those skilled in the art, the rib width may depend on inherent limitations of etching techniques, for example limitations of the mask used.

Figure 6:
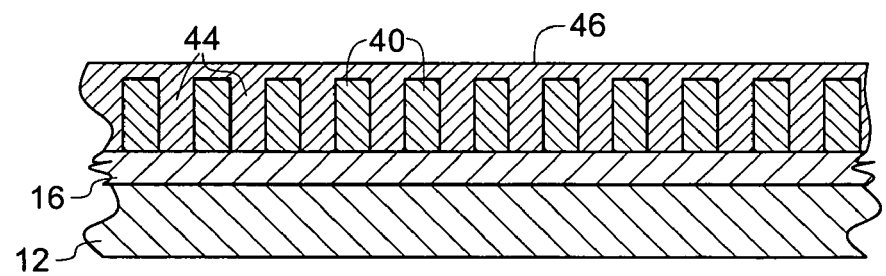

Following channel formation in the sacrificial layer, plating is carried out as shown in FIG. 6. The plating may be through electroplating, in one example. The plating substantially covers the channels and forms an upper layer 46 of plating material as shown. In this embodiment, the plating material comprises a thermally conducting material, such as copper, silver, gold or an alloy of these. In the illustrated example copper has been used.

Figure 7:
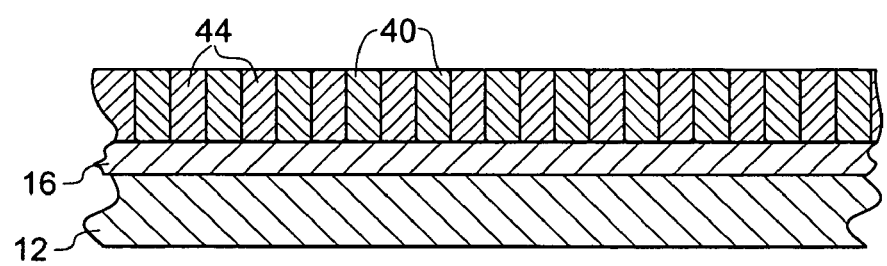

The upper layer 46 of the plating material formed above the rib 40 of the channel is removed to expose the sacrificial layer 36, as shown in FIG. 7. The plating material may be removed by grinding. The grinding is carried out so that a top surface of the plating material and the rib 40 are on a same plane to expose the sacrificial layer 36.

Figure 8:
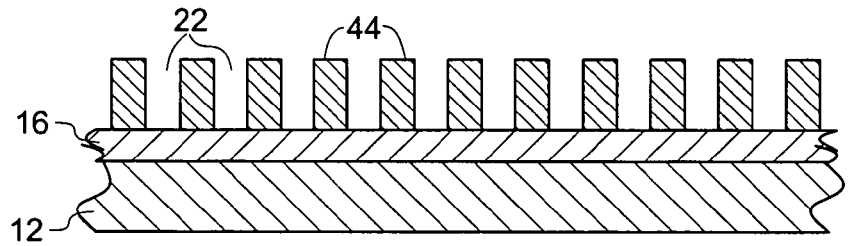

FIG. 8 illustrates microchannel formation in the sacrificial layer 36. The exposed sacrificial layer 36 made of silicon is etched using a solution of potassium hydroxide. The potassium hydroxide solution etches silicon while the copper used for plating, and which forms conductive ribs 44, remains. A region between the conductive ribs, previously of silicon, forms the microchannels 22. The microchannels may be defined in terms of an aspect ratio of width to height of the microchannels 22. For a cooling system, it is desirable to have as high an aspect ratio as possible. The width of the microchannels 22 follows the width of the rib 40 and is less than about 200 microns. In a specific embodiment, the microchannels have a width from about 100 microns to about 200 microns. The microchannels may be about 400 microns deep. In particular embodiments, the depth of the microchannel may vary from about 300 microns to about 400 microns. Based on the width and height of the microchannels, the aspect ratio of the microchannels is in a range from about 1:2 to about 1:3.

Figure 9:
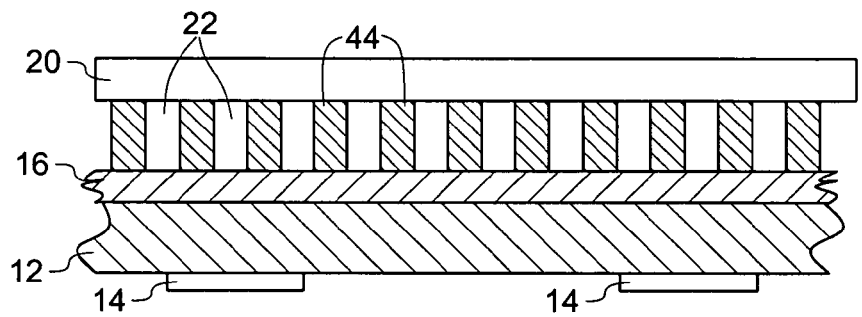

FIG. 9 shows the addition of the manifold 20 and the devices 14 on the cooling system. Subsequent to microchannel formation, the manifold 20 is attached to the thermally conductive ribs 44 between which the microchannels are formed. Further, the devices that have been attached on an outer surface of the substrate 12 are represented by reference numeral 14. In practice, a single device or a plurality of devices may be mounted on the substrate as shown. It should be noted that, where desired, and depending upon the particular processing used, the devices may actually be mounted prior to formation of the microchannels.

Figure 10:
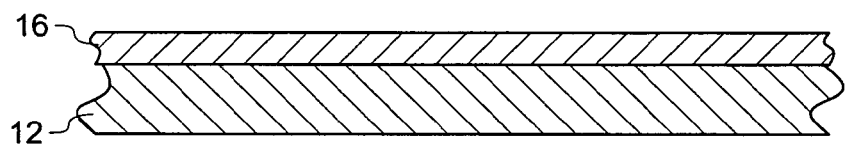
FIGS. 10-12 illustrate fabrication stages of microchannels in accordance with a variant of the embodiment of FIGS. 3-9.
Figure 11:
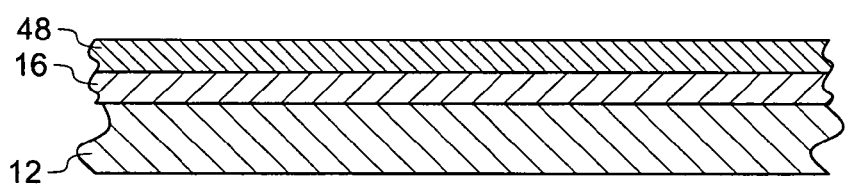
Figure 12:
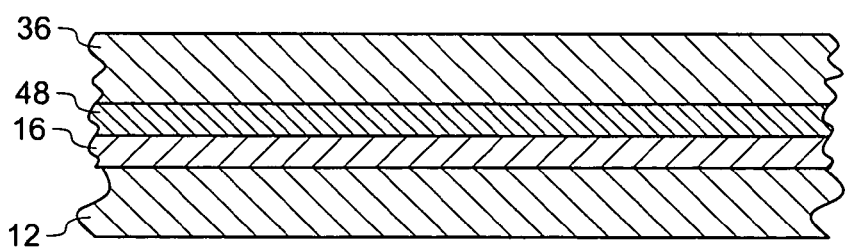

FIGS. 10-12 depict a variation on the fabrication steps of the microchannels with an additional conductive layer. FIG. 10 depicts the substrate 12 over which the conductive layer 16 is formed. The substrate is again a semiconductor material. The conductive layer 16 is formed by deposition, using a sputtering technique, on the substrate 12. The sputtering results in a thickness of about 1 micron in a present embodiment. The conductive layer 16 is made of a material with good thermal conductivity, such as copper. A second conductive layer 48, such as copper, may be deposited over the layer 16 as shown in FIG. 11, and secured to the underlying layer by direct bonding between the materials constituting these layers. The second conductive layer 48 may be plated over the first conductive layer 16. FIG. 12 shows the formation of the sacrificial layer 36 on the second conductive layer 48. Typical thickness of the sacrificial layer 36 formed is less than about 400 microns. The thickness of the layer 36 may vary depending on depth of microchannels 22 desired. Fabrication stages as discussed with reference to FIGS. 5-8 may then be followed to form the microchannels in the sacrificial layer 36.

Figure 13:
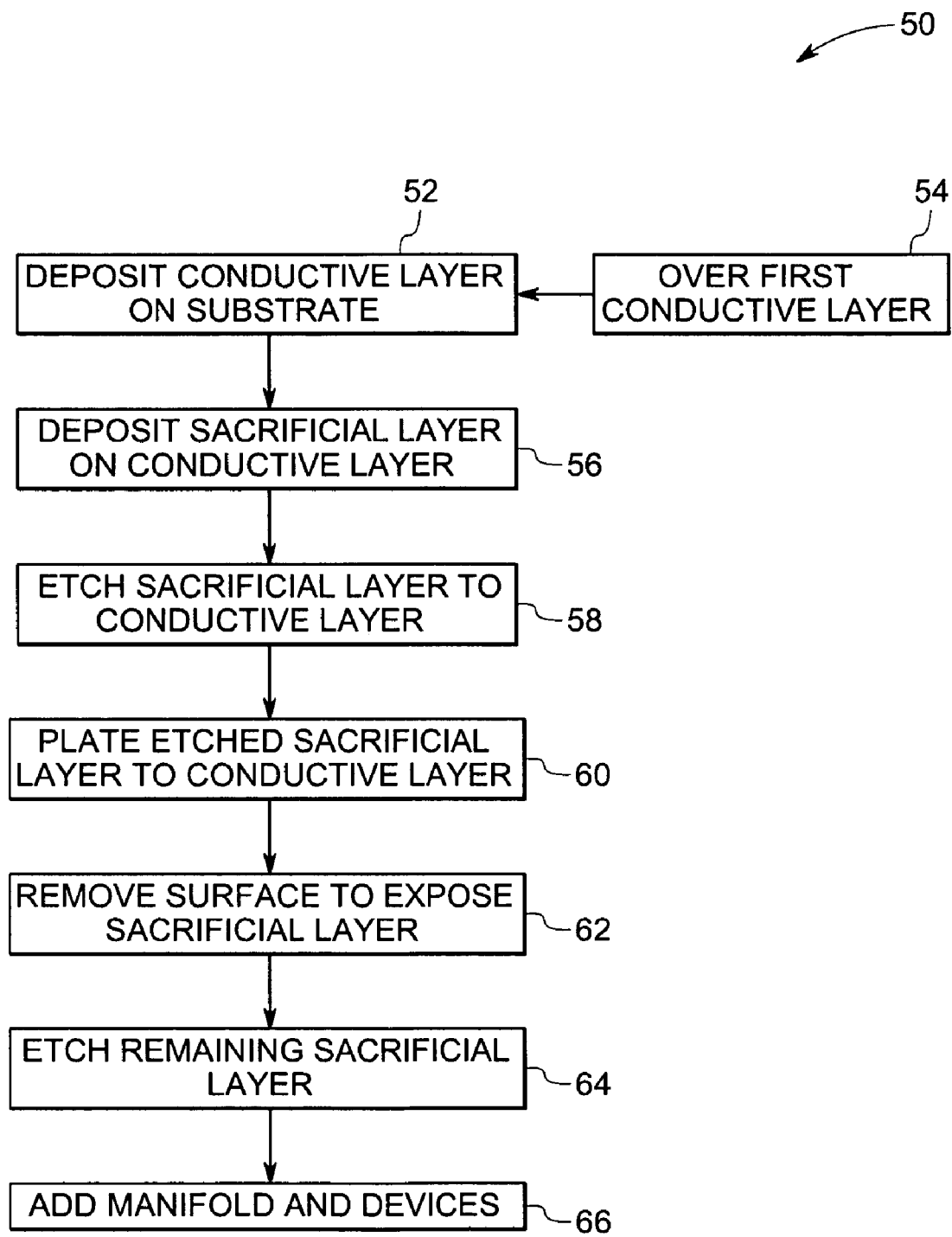
FIG. 13 is a flow chart depicting a method of fabricating microchannels in accordance with the embodiment of FIGS. 3-9.

The method of forming microchannels 22 illustrated above is summarized using a flow chart 50 of FIG. 13. At step 52 of the FIG. 13, a conductive layer is deposited on the inner surface of the substrate. Again, the conductive layer is deposited through a sputtering technique or by electroplating. Optionally, a second conductive layer may be added over the conductive layer, as represented by step 54. The sacrificial layer is then deposited on the conductive layer at step 56. At step 58, the sacrificial layer is etched to the conductive layer to form channels. The etched sacrificial layer is then plated in step 60 to substantially fill the channels as illustrated in FIG. 6. Further, the thin surface of the plating material is removed at step 62 to expose the surface of the sacrificial layer, such as by grinding. The remaining sacrificial layer is then etched in step 64 to form microchannels. A selective etchant discussed with reference to step 58 may be used. The etchant removes the sacrificial layer while the plating material remains unetched. Regions of etched sacrificial layer forms the microchannels separated by heat exchanging ribs. In step 66, the manifold and devices are added. Subsequent to microchannel formation devices are mounted on the substrate, and the manifold is attached on a surface facing the microchannels.

Figure 14:
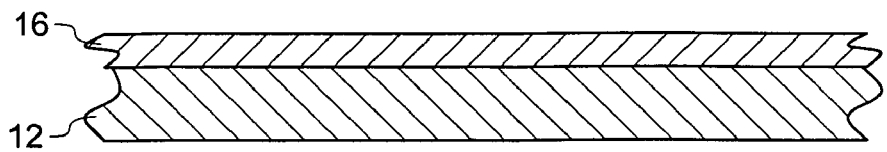
FIGS. 14-20 illustrate fabrication stages of microchannels in accordance with the embodiment of FIGS. 10-12.

In accordance with yet another plating embodiment, a method of forming microchannels is provided as shown in FIGS. 14-20. In the illustrated embodiment, the conductive layer 16 is formed on the substrate 12 as shown in FIG. 14. The conductive layer is formed using deposition techniques known to those skilled in the art, such as sputtering. Typical thickness of the conductive layer 16 is less than about 300 microns, although this may vary. Suitable substrates again include semiconductors used in power electronic devices such as Si, SiC, Alumina, AlN, GaN, or a combination of these. As before, the conductive layer 16 is made of a conducting material such as Cu, Ag, Au, or any combinations thereof, or any other suitable material.

Figure 15:
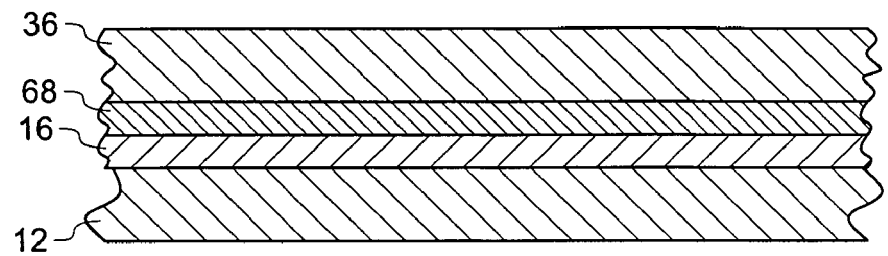

As illustrated in FIG. 15, the sacrificial layer 36 is formed on the conductive layer 16 with the help of an adhesive layer 68. The adhesive layer 68 is sandwiched between the layers 16 and 36 and promotes bonding between the adhesive layer 68 and the conductive layer 16, and also between the adhesive layer 68 and the sacrificial layer 36. Typical thickness of the adhesive layer 68 may be about 12 microns to about 14 microns. Suitable adhesive material includes a thermosetting material, a thermoplastic material or an epoxy. In this example, the sacrificial layer 36 is made of silicon, although other materials may be used. Typical thickness of the sacrificial layer 36 is less than about 400 microns. The thickness of the layer 36 may vary depending on depth of microchannels desired.

Figure 16:
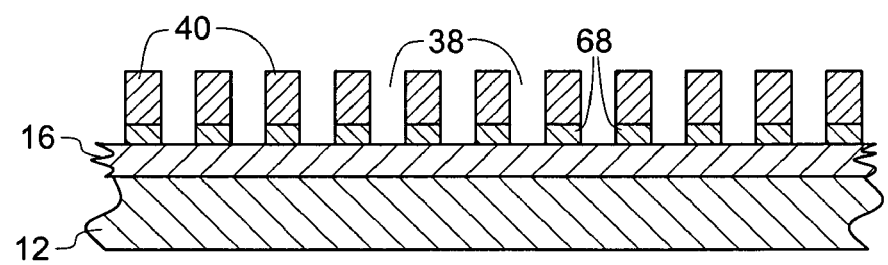

FIG. 16 illustrates formation of channels in the sacrificial layer 36. Elements 40 are ribs, and channels 38 in sacrificial layer 36 and the adhesive layer 68, and are formed by sawing to the conductive layer 16 to form the ribs 40. It has been found that silicon having 110 orientation on sawing form good vertical channels. Further, any sawing method known in the art may be used. In one example, a thermocarbon blade is used and parameters of sawing are adjusted to form channels of about 100 microns wide. The grooves 38 may have a depth of less than about 400 microns. In particular examples, the grooves 38 may have a depth of from about 300 microns to about 400 microns. The formation of channels results in ribs 40 having a width of less than about 200 microns in a present embodiment. In a specific embodiment, the ribs 40 have a width of about 100 microns to about 200 microns.

Figure 17:
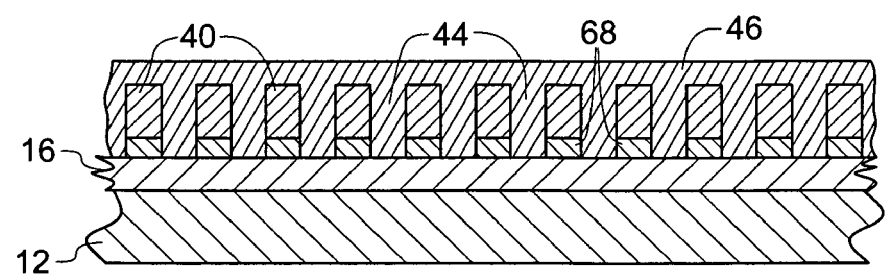
Figure 18:
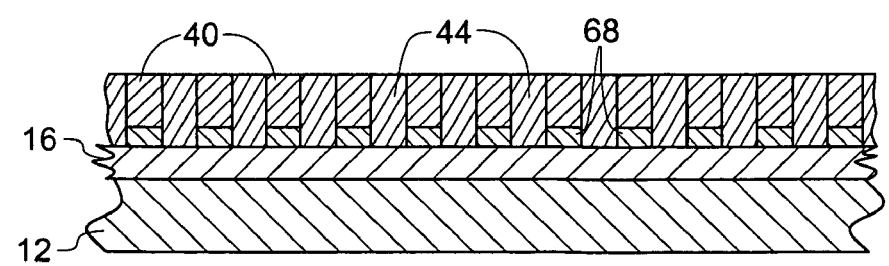

In FIG. 17, a plating material is added on the sacrificial layer 16 to substantially fill the grooves 38 and form the surface 46 of the plating material, as in the embodiment described above. Next, as illustrated in FIG. 18, the plating material is ground to expose the sacrificial layer 36. The grinding results in a top surface of the sacrificial layer 36 and the plating material being on a same plane.

Figure 19:
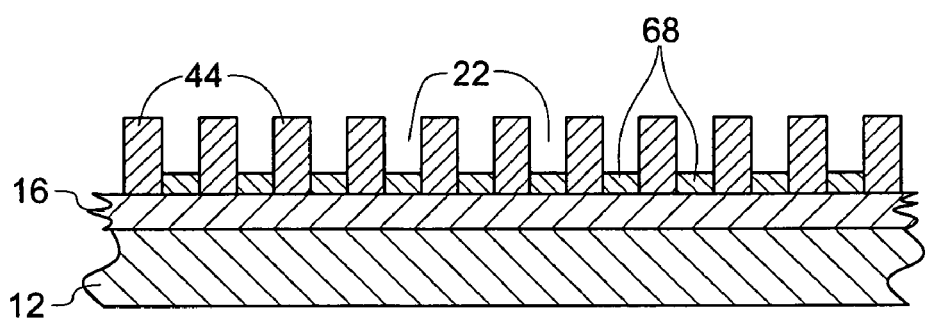
Figure 20:
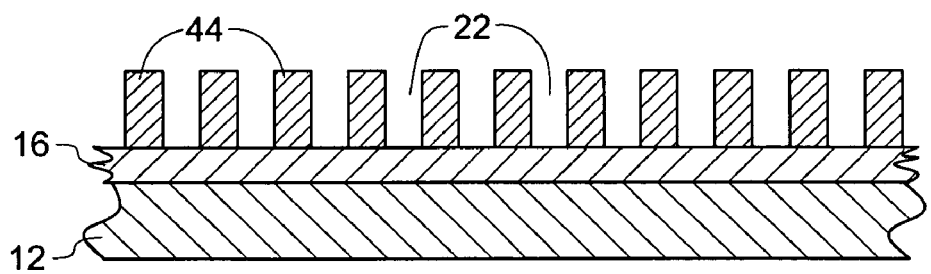

Following grinding, the exposed sacrificial layer 36 is etched to the adhesive layer 68, as shown in FIG. 19. The etching is carried out through an etchant that preferentially etches the sacrificial layer remaining between the ribs. Alternatively, a method of masking with subsequent etching may be used, such that a region exposed to etchant is removed. A potassium hydroxide solution is an acceptable etchant for a sacrificial layer made of silicon. Potassium hydroxide preferentially etches silicon while the underlying adhesive layer 68 is not affected. The exposure to the potassium hydroxide solution is continued until the adhesive layer 68 is reached. The adhesive layer 68 is then etched to expose the conductive layer 16, as shown in FIG. 20. Again, an etchant that etches the adhesive layer while the conductive layer 16 remains unetched is used. The etching results in formation of the conductive ribs 44. A region between the conductive ribs 44, previously of silicon and adhesive, form the microchannels 22. The resulting dimensions of the ribs and microchannels may be similar to those described above for the first embodiment.

Figure 21:
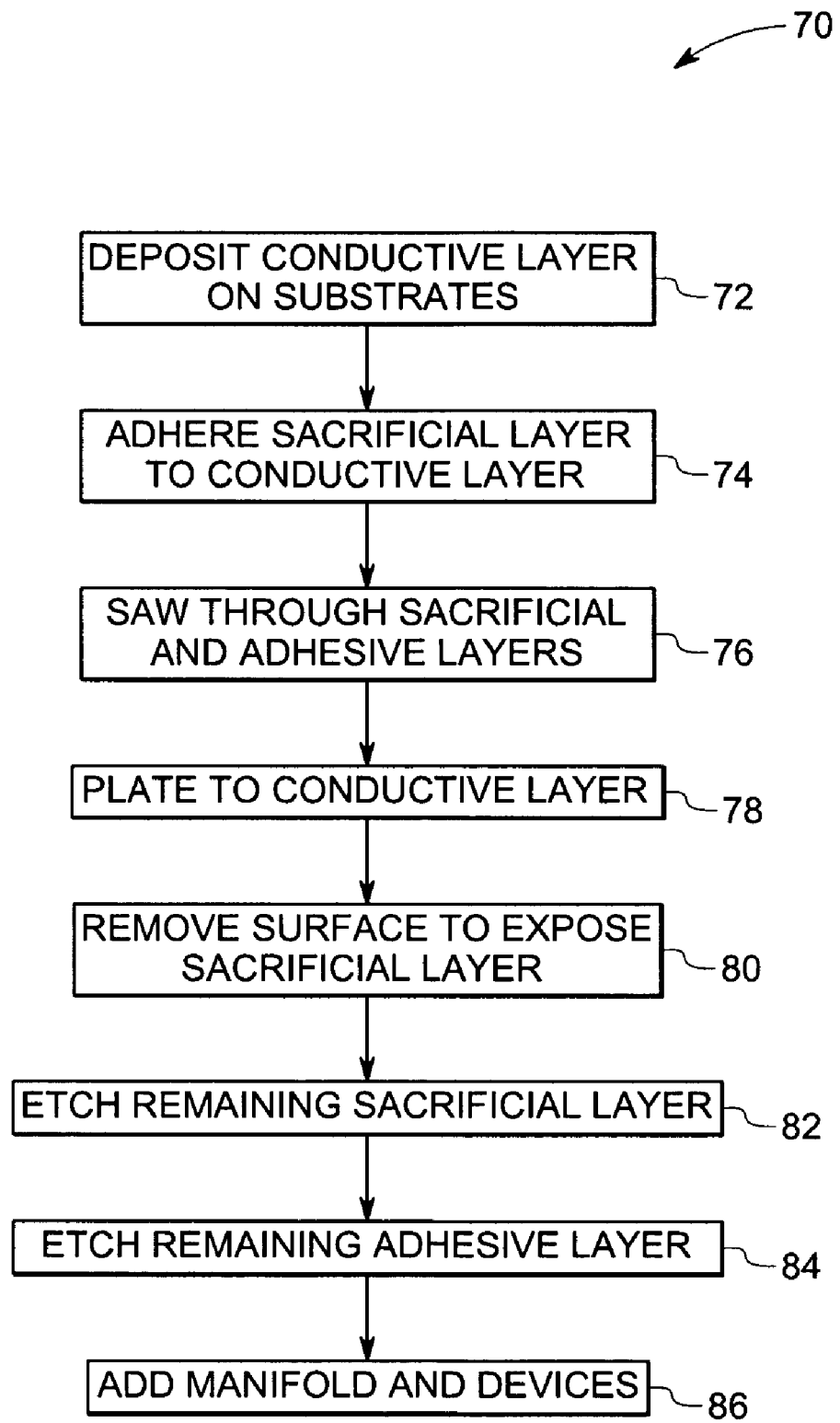
FIG. 21 is a flow chart of a method of fabricating microchannels in accordance with another variant of the method.

FIG. 21 is a flow chart 70, illustrating the method employing sawing to form microchannels prior to plating. At step 72, a conductive layer is deposited on the substrate.

A sacrificial layer is then adhered to the conductive layer by means of an adhesive layer, as represented by step 74. At step 76, channels are formed in the sacrificial layer by sawing. Sawing may result in debris formation at the edges of the sacrificial layer, which is removed during cleaning. It should be noted that the channel shape resulting from sawing may depend on the material used. In one example, as noted above, silicon having an orientation of 110 is used as the sacrificial layer which on sawing results in a vertical channel. Following sawing to form channels, a plating material is deposited on the sawed sacrificial layer at step 78. The surface formed as a result of plating is removed at step 80 to expose the sacrificial layer. At step 82, the exposed sacrificial layer is etched, and at step 84, the adhesive layer is removed by etching to form microchannels. Following channel formation, manifold and devices are added, at step 86, to form a device cooling system.

In accordance with another embodiment, microchannels are formed through laser ablation of a substrate having an inner surface and an outer surface. A copper, or such thermally conducting material is disposed on the inner surface of the substrate to form a conductive layer, and microchannels are formed in the copper layer by successive ablation of progressively deeper channels in the conductive layer.

Figure 22:
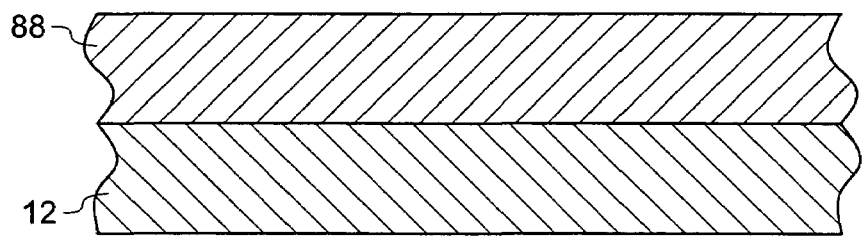
FIGS. 22-26 illustrate fabrication stages of microchannel formation according to a laser ablation technique.

FIGS. 22-26 illustrate fabrication stages of microchannel formation by laser ablation. As illustrated in FIG. 22, a copper layer 88 is formed on the substrate 12. The substrate 12 is a semiconductor material commonly used in power electronic devices, such as one of the materials described above. The copper layer 88 is deposited on the substrate 12 through an electroplating process, in one example. Other techniques known to those skilled in the art may be used. The electroplating results in a copper layer 88 having a thickness of about 400 microns in a present example, although other thicknesses may be used.

Figure 23:
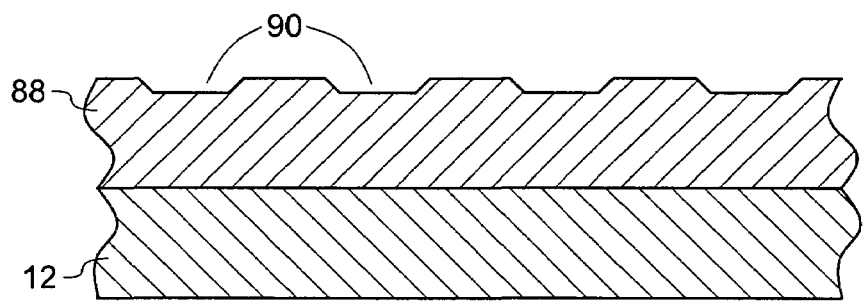

The copper layer 88 is laser ablated, as shown in FIG. 23, to form partially ablated channels 90. In one example, between successive laser ablation steps, a silicone mold release agent, or other cleaning medium is applied on the copper layer 88. It has been found that the ablation process may result in debris within the progressively formed microchannels that may reattach to the walls of the microchannels. The application of the cleaning agent between ablation steps effectively removes this debris, or at least prevents it from reattaching to the microchannel wall. The copper layer is then subjected to laser ablation and again is sprayed with silicone mold release agent. After each application of the cleaning agent, the surface is wiped to remove debris formed as a result of laser ablation. In another example, the substrate is flushed with water between successive laser ablation passes to remove the debris formed.

Alternatively, a chemical etch clean-up may be used. In such cases, a chemical etch stop may be applied on the copper layer 88. The copper layer 88 is then subjected to laser ablation. Following laser ablation, a ferric chloride solution is disposed on the copper layer and debris resulting from ablation is rinsed off to form partially ablated channels 90. The ablate and etch process may be done in successive passes until the desired depth is achieved.

Optionally, the laser ablation may be carried out under water using techniques known to one skilled in the art, for example the laser beam passes through water and ablates the substrate. Advantageously, this may result in clearing debris formed as a result of successive laser passes and may result in faster laser ablation rate but a higher laser power may be required.

Figure 24:
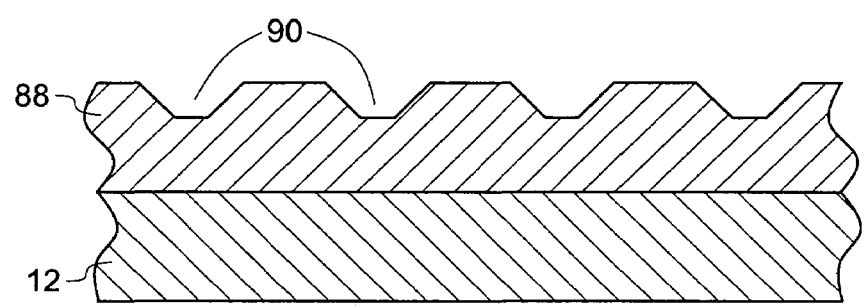
Figure 25:
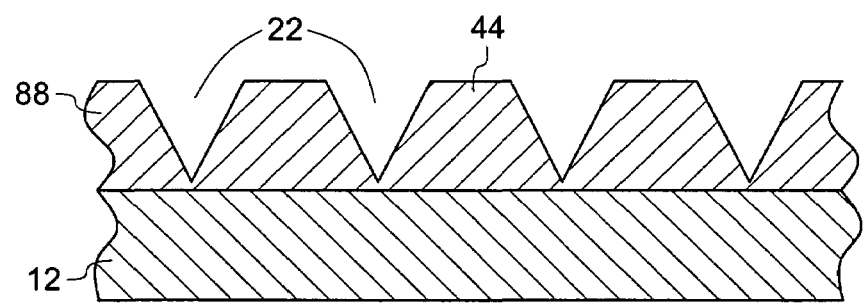

FIG. 24 shows a partially ablated channel 90 having deeper channels than those shown in FIG. 23. The silicone mold release agent is again applied on the copper layer and is followed by laser ablation and the debris is wiped off to form deeper channels 90. Similarly, when a chemical etch stop is applied on the copper layer the debris that forms is rinsed off after applying a ferric chloride solution. The steps discussed with reference to FIG. 24 are repeated to progressively form the microchannels to a desired depth, as shown in FIG. 25. The microchannels 22 resulting through laser ablation are typically V-shaped. Typical thickness of the microchannels is less than about 200 microns in a present embodiment. In specific embodiments, the thickness may vary from about 100 microns to about 200 microns. The microchannels may be less than about 400 microns deep. In particular embodiments, the depth of the microchannels may vary from about 300 microns to about 400 microns. Following microchannel formation, the silicone release agent or other chemicals used during the ablation may be removed. In one example, 50 percent by volume of limonene and propanol solution is used to remove the adhering silicone release agent. Additionally, nitrogen gas may be used to blow off the debris.

Figure 26:
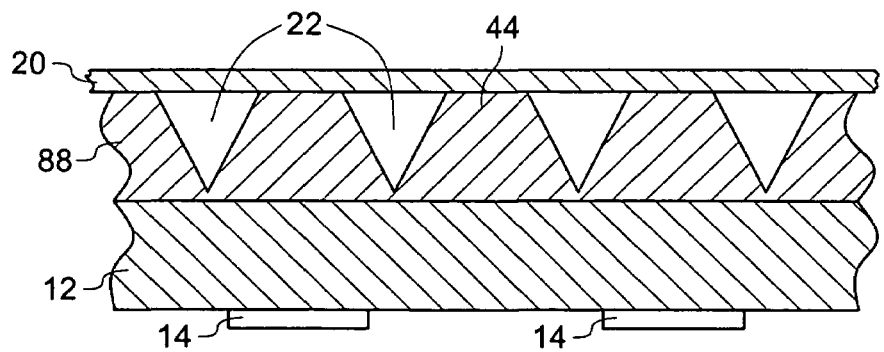

As illustrated in FIG. 26, the manifold 20 and the device 14 are then added. A surface of the manifold includes an inlet manifold in fluid communication with the microchannels and operable to introduce a coolant to the microchannels 22, and an outlet manifold in fluid communication with the microchannels 22 and operable to exhaust the coolant from the microchannels 22, as in the previous embodiments. The devices 14 are mounted proximate to the outer surface of the substrate. As mentioned above, in certain applications, the devices may be mounted prior to laser ablation and addition of the manifolds.

Figure 27:
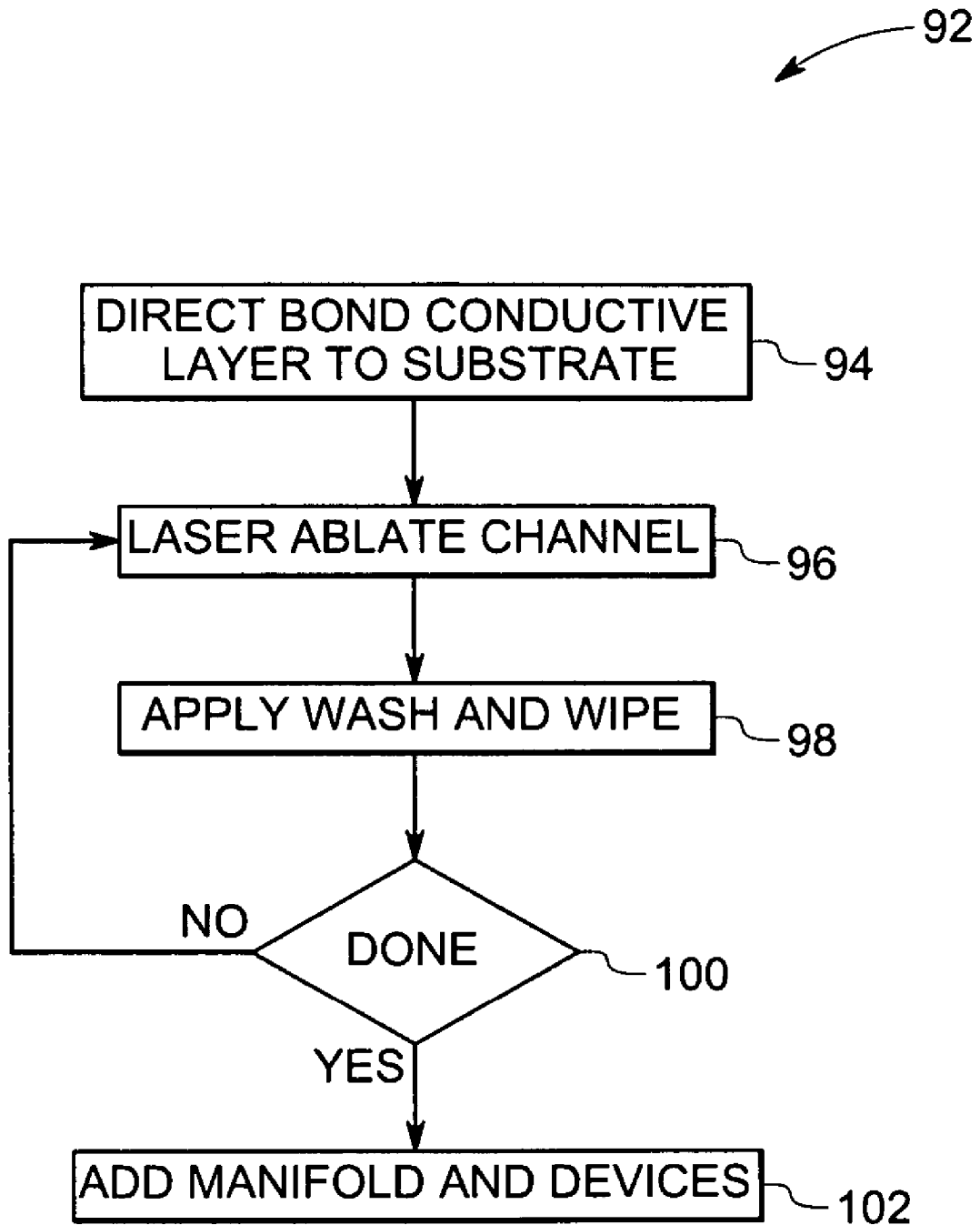
FIG. 27 is a flow chart of a method of fabricating microchannels in accordance with the embodiment of FIGS. 22-26.

The fabrication method of FIGS. 22-26 is summarized in flow chart 92 of FIG. 27. At step 96, the thermally conductive layer is subjected to laser ablation. The laser parameters, such as time of exposure, power of the laser is measured and standardized before exposing the thermally conductive layer, and will typically depend upon the nature and design of the laser, the material used for the conductive layer, and the desired depth of the microchannels. At step 98, following laser ablation, the silicone release agent is applied on the thermally conductive layer and the layer is wiped to remove debris. Steps 96 and 98 are repeated a number of times until the desired channel dimension is obtained. In one example, the steps 96 and 98 were repeated a sufficient number of times to obtain a channel depth of about 100 microns. Laser ablation results in a V-shaped channel. After the microchannel formation a clean-up is carried out. The clean-up includes a combination of scrubbing, applying a solvent or blowing a gas. At step 102, a manifold, and power electronic devices are mounted on the processed substrate and thermally conductive layer.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method comprising,
   forming a conductive layer on an inner surface of a substrate;
   providing a sacrificial layer over the conductive layer;
   forming a plurality of channels in the sacrificial layer;
   plating the sacrificial layer to substantially fill the plurality of channels with a plating material comprising conducting material that contacts and extends from the conductive layer; and
   etching the sacrificial layer to form a conducting structure having fins where conducting material remains separated by microchannels where the sacrificial layer is etched.

2. The method of claim 1, the substrate comprising silicon, silicon carbide, aluminum nitride, alumina, gallium nitride or a combination thereof.

3. The method of claim 1, further comprising mounting a power electronic device proximate to an outer surface of the substrate.

4. The method of claim 1, wherein forming the conductive layer comprises sputtering of a conducting material on the inner surface, or disposing the conducting material on the inner surface using an adhesive.

5. The method of claim 4, the adhesive comprising an epoxy, a thermoplastic material, a thermosetting material or a combination thereof.

6. The method of claim 1, wherein the conductive layer has a thickness of less than about 300 microns.

7. The method of claim 1, the sacrificial layer comprising silicon.

8. The method of claim 1, wherein the sacrificial layer has a thickness of less than about 400 microns.

9. The method of claim 1, wherein the plurality of channels are formed by etching the sacrificial layer.

10. The method of claim 1, wherein the plurality of channels are formed by sawing the sacrificial layer.

11. The method of claim 1, wherein the microchannels have a width of less than about 200 microns.

12. The method of claim 11, wherein the microchannels have a width of from about 100 microns to about 200 microns.

13. The method of claim 1, wherein the microchannels are less than about 400 microns deep.

14. The method of claim 13, wherein the microchannels are about 300 microns to about 400 microns deep.

15. The method of claim 1, wherein the microchannels have an aspect ratio of width to height of about 1:2 to about 1:3.

16. The method of claim 1, wherein plating the sacrificial layer comprises electroplating.

17. The method of claim 1 further comprising providing an inlet manifold in fluid communication with the microchannels to introduce a coolant in the microchannels, and providing an outlet manifold in fluid communication with the microchannels to exhaust the coolant from the microchannels.

18. The method of claim 17, further comprising providing an inlet plenum to introduce the coolant to the inlet manifold, and providing an outlet plenum to exhaust the coolant from the outlet manifold.

19. The method of claim 1, further comprising forming an additional conductive layer over the conductive layer.

20. A method comprising:
    forming a copper layer on an inner surface of a substrate;

forming a sacrificial layer comprising silicon over the copper layer;

forming a plurality of channels in the sacrificial layer;

plating the sacrificial layer with copper to substantially fill the plurality of channels; and etching the sacrificial layer to leave a copper structure having microchannels where the sacrificial layer has been etched, wherein an aspect ratio of width to height of the microchannels is in a range of about 1:2 to about 1:3.

21. A method comprising, disposing a layer of a first thermally conductive material on a surface of a substrate;

disposing a sacrificial layer over the thermally conductive material;

forming a plurality of channels in the sacrificial layer;

plating the sacrificial layer to substantially fill the plurality of channels with a plating material comprising a second thermally conductive material; and removing remaining portions of the sacrificial layer to form a thermally conducting structure having fins made of the second conductive material separated by microchannels where the remaining sacrificial layer was removed.

22. The method of claim 21, wherein the first and second thermally conductive materials are the same material.

23. The method of claim 21, wherein the plurality of channels are formed by etching the sacrificial layer.

24. The method of claim 21, wherein the plurality of channels are formed by sawing the sacrificial layer.

* * * * *